United States Patent
Ansari et al.

(10) Patent No.: US 9,300,320 B2
(45) Date of Patent: Mar. 29, 2016

(54) SYSTEM AND METHOD FOR DICTIONARY-BASED CACHE-LINE LEVEL CODE COMPRESSION FOR ON-CHIP MEMORIES USING GRADUAL BIT REMOVAL

(71) Applicant: QUALCOMM INCORPORATED, San Diego, CA (US)

(72) Inventors: Amin Ansari, San Diego, CA (US); Vito Bica, Poway, CA (US); Richard Senior, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/318,564

(22) Filed: Jun. 27, 2014

(65) Prior Publication Data

US 2015/0381201 A1 Dec. 31, 2015

(51) Int. Cl.
*H03M 7/30* (2006.01)
*H04N 19/00* (2014.01)
*G06F 12/08* (2006.01)

(52) U.S. Cl.
CPC .............. *H03M 7/3064* (2013.01); *H03M 7/30* (2013.01); *H04N 19/00* (2013.01); *G06F 12/0886* (2013.01); *G06F 2212/401* (2013.01)

(58) Field of Classification Search
CPC ....... H03M 7/3064; H03M 7/30; H03M 7/42; H03M 7/6023; H03M 7/3084; H03M 7/3088; H03M 7/40
USPC .......................................... 341/65, 50, 51, 87
See application file for complete search history.

(56) References Cited

U.S. PATENT DOCUMENTS

| | | | |
|---|---|---|---|
| 7,280,052 B2 | 10/2007 | Levy | |
| 7,696,906 B2 | 4/2010 | Dey | |
| 8,275,897 B2 * | 9/2012 | Fallon | 709/231 |
| 2007/0019723 A1 * | 1/2007 | Valente | 375/240.12 |
| 2009/0174583 A1 * | 7/2009 | Diaz-Gutierrez et al. | 341/65 |
| 2010/0223237 A1 | 9/2010 | Mishra et al. | |
| 2014/0022098 A1 | 1/2014 | Fallon | |

(Continued)

OTHER PUBLICATIONS

Seok-Won Seong et al., An Efficient Code Compression Technique using Application-Aware Bitmask and Dictionary Selection Methods, University of Florida, 2007, pp. 582-587.

(Continued)

*Primary Examiner* — Jean B Jeanglaude
(74) *Attorney, Agent, or Firm* — Smith Risley Tempel Santos LLC

(57) ABSTRACT

A multi-pass compression iteratively removes combinations of bits from locations in each word of a cache line of an uncompressed data stream. For each combination of removed bits, the remaining bits in the word values of the cache line are analyzed to generate a compression score. A highest compression score triggers the building of a dictionary from the remaining bits in the word values of the cache line. After a dictionary is built, the method may continue iteratively to create subsequent dictionaries from the words that remain uncompressed in the cache line. To decompress a word, a first bit section of the compressed word is used to identify a dictionary that is then queried for bits indexed in a second bit section of the compressed word. The uncompressed word is reconstructed by interleaving the queried bits with the removed combination of bits from a third bit section of the word.

30 Claims, 7 Drawing Sheets

(56) References Cited

U.S. PATENT DOCUMENTS

2014/0085115 A1 3/2014 Beier et al.
2014/0104085 A1 4/2014 Cohen

OTHER PUBLICATIONS

International Search Report and Written Opinion—PCT/US2015/036752—ISA/EPO—Sep. 22, 2015.

* cited by examiner

SYSTEM AND METHOD FOR DICTIONARY-BASED CACHE-LINE LEVEL CODE COMPRESSION FOR ON-CHIP MEMORIES USING GRADUAL BIT REMOVAL

DESCRIPTION OF THE RELATED ART

Portable computing devices ("PCDs") are becoming necessities for people on personal and professional levels. These devices may include cellular telephones, portable digital assistants ("PDAs"), portable game consoles, palmtop computers, and other portable electronic devices. PCDs commonly contain integrated circuits, or systems on a chip ("SoC"), that include numerous components designed to work together to deliver functionality to a user. Generally speaking, the more functionality that a PCD is required to provide to a user, the more processing components and memory components a designer must find space for on the SoC.

With a trend toward compact PCD form factors, space on a SoC comes at a premium for PCD designers and, as such, the increased demand for functionality creates inherent form factor design difficulties. The increased demand for functionality also drives up power consumption in a PCD, making it necessary for designers to include more power capacity. More power capacity also competes for space within the PCD.

With the limited space of today's PCD form factors being in conflict with the demand for more functionality, designers look for processing and memory components that maximize processing and storage capacity per amount of space taken up on the SoC. Additionally, PCD designers look for ways to better utilize the processing and memory capacity available in the PCD, thereby possibly mitigating the need to squeeze in additional or physically larger components.

Memory capacity, in particular, requires an inordinate amount of space on a typical SoC. Consequently, designers are always interested in ways to minimize the amount of storage capacity that is needed to deliver target levels of functionality. One way that memory capacity is kept at a minimum is by using compression techniques to store data streams in a compact manner. Compression of data reduces the amount of memory needed (thus saving space) and the amount of bandwidth required to transmit data to processing components (thus conserving bus bandwidth for other functionality) as well as minimizes the amount of static and dynamic energy consumed for data storage.

Notably, prior art compression methods are not well suited for compression of data in tightly coupled memory components such as cache memory components. Therefore, there is a need in the art for a low latency compression/decompression system and method that builds compression dictionaries from subsets of bits within a cache line. Further, there is a need in the art for a compression/decompression system and method that progressively constructs a series of dictionaries to further improve a compression ratio beyond that which may be capable by a single pass technique.

SUMMARY OF THE DISCLOSURE

Various embodiments of methods and systems for cache-line level compression and decompression ("CLADE") of a data stream in a system on a chip ("SoC") in a portable computing device ("PCD") are disclosed. Embodiments of a CLADE solution compress data at a fined grained level, such as at a cache line level, and then decompress the data with low latency times. Consequently, certain CLADE codec embodiments are particularly well suited for compression and decompression of data streams stored in memory devices tightly coupled to a processing component.

An exemplary CLADE method is a multi-pass compression approach that begins by iteratively removing combinations of bits from locations in each word of a cache line of an uncompressed data stream. For each combination of removed bits, the remaining bits in the word values of the cache line are analyzed using an objective function that generates a compression score that quantifies the value of a dictionary built from the remaining bits in the word values of the cache line. Based on a highest compression score, a first dictionary is generated from the remaining bits in the word values after removal of the combination of bits associated with the highest compression score.

Using the first dictionary, cache lines in the data stream are compressed on a first compression round such that one or more of the words is compressed to include three bit sections, the first bit section indicating the first dictionary, the second bit section comprising an index to bits stored in the first dictionary, and the third bit section containing the removed combination of bits. The method continues iteratively on the words in the cache lines that remain uncompressed after the previous round of dictionary creation and data stream compression. In this way, the CLADE methodology may generate a plurality of dictionaries that may be used to compress and decompress individual words in a cache line of a data stream.

To decompress the words, the CLADE methodology recognizes a request from a processing component to the tightly coupled memory device for the cache line and then delivers a reconstructed, decompressed word to the processing component by 1) identifying a dictionary from the first bit section of the word, 2) querying the identified dictionary for bits indexed in the second bit section of the word, and 3) reconstructing the word by interleaving the queried bits with the removed combination of bits from the third bit section of the word. Once the word is decompressed, it can then be delivered to the processing component.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1A:
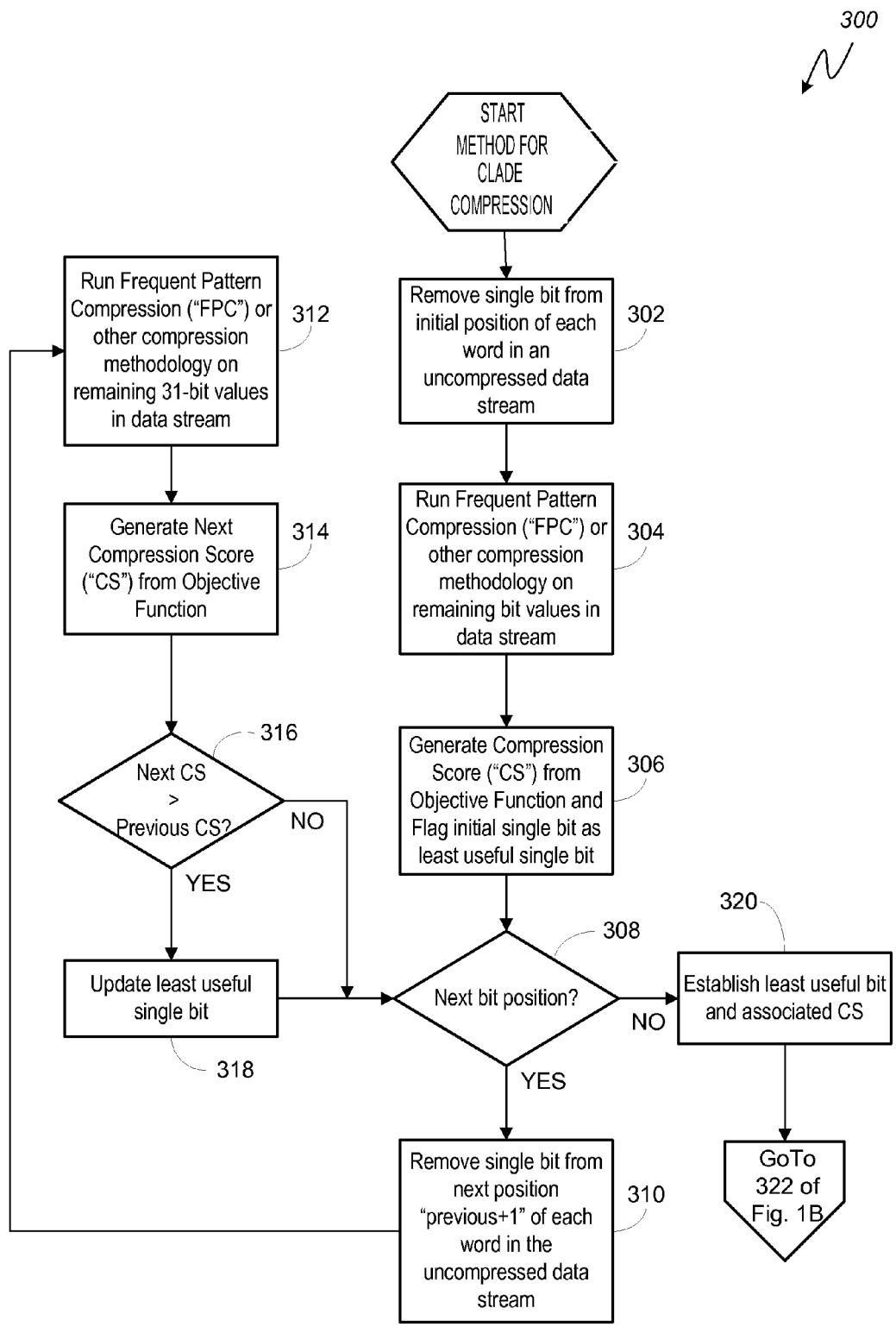
FIGS. 1A-1B are a logical flowchart illustrating a method for data stream compression according to a cache-line level compression and decompression ("CLADE") embodiment.

The word "exemplary" is used herein to mean serving as an example, instance, or illustration. Any aspect described herein as "exemplary" is not necessarily to be construed as exclusive, preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

In this description, reference to a "cache" or a "tightly coupled memory" are used interchangeably and will be understood to envision any memory device in which a benefit may be had via use of a fine-grained, low latency compression/decompression methodology such as a cache-line level compression and decompression ("CLADE") solution. As such, the following description of exemplary CLADE embodiments within the context of a data stream associated with a processor having a tightly coupled memory will not limit the scope of the disclosure specifically to cache memory devices.

In this description the terms "code," "data stream," "image," "cache line" and the like are used interchangeably. Depending on the context of their use, it will be understood that a "code," "data stream," "image," or "cache line" may be uncompressed, compressed or decompressed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "central processing unit ("CPU")," "digital signal processor ("DSP")," "graphical processing unit ("GPU")," and "chip" are used interchangeably. Moreover, a CPU, DSP, GPU or chip may be comprised of one or more distinct processing components generally referred to herein as "core(s)."

In this description, the terms "engine," "processing engine," "processor," "processing component" and the like are used to refer to any component within a system on a chip ("SoC") that requires a data stream to be compressed to a memory component or decompressed from a memory component. As such, a processing engine may refer to, but is not limited to refer to, a CPU, DSP, GPU, modem, controller, etc.

In this description, the term "portable computing device" ("PCD") is used to describe any device operating on a limited capacity power supply, such as a battery. Although battery operated PCDs have been in use for decades, technological advances in rechargeable batteries coupled with the advent of third generation ("3G") and fourth generation ("4G") wireless technology have enabled numerous PCDs with multiple capabilities. Therefore, a PCD may be a cellular telephone, a satellite telephone, a pager, a PDA, a smartphone, a navigation device, a smartbook or reader, a media player, a combination of the aforementioned devices, a laptop computer with a wireless connection, among others.

As discussed above, on-chip memory is a large consumer of space on a SoC. The ever increasing demand for functionality has led designers to add more memory and different cache hierarchies in an effort to accommodate all the data needed in order to deliver the functionality. Tightly coupled memory, i.e. lean, low-latency memory dedicated to a given processing component, has become more and more common in SoCs to ensure that processing components have efficient and quick access to the data they need.

In order to maximize the limited memory space of tightly coupled memory ("TCM") devices, or any memory device for that matter, it is desirable to compress the code stored thereon. With TCM devices, however, the need for low latency delivery of code data in response to a request from its processing engine means that many compression techniques known in the art are less than ideal, if not altogether inapplicable.

Code takes up a lot of the space on the memory chip(s) of a SoC. Therefore, anything that reduces the code results in a savings of memory. For most compression methodologies, the boundary of the problem is the cache line in that compressing a data stream at a level smaller than a cache line is less than optimal—i.e., for most compressed data streams, decompression of a cache line requires everything in the cache line.

Many prior art codec algorithms rely on a look-back period in order to recognize patterns during compression. Such codecs compress cache lines in a data stream based on a "look back" that identifies a previous instance of a cache line having the same word pattern in the original non-compressed data stream. A pointer is used to send the decompression engine back to a starting point for the previous instance of the recognized string in the original non-compressed data stream (e.g., the pointer value may be 20 to indicate that the engine should go back 20 characters and start copying from the output stream). Notably, "look-back" approaches may not be able to take advantage of a pattern of bit subsets that exist in the words of a cache line to point to bit subset patterns instead of a full 32 bit cache word, for example.

For example, if look-back compression methodology recognizes an A, B, C, D, E word pattern in a data stream it is compressing, and looking back 5 MB in the stream it recognizes the same pattern, then a pointer indicating that the pattern has been seen in the data before is inserted such that when decompressing the stream the words may simply be copied from the location of its first instance. Compressing beneath a cache line boundary, however, presents limited opportunity for look back because the amount of data available for look back at any given moment may be very limited—for example, eight words in a typical cache line. As such, the opportunity for finding patterns within eight words, for example, is not very significant. Advantageously, embodiments of a cache-line level compression and decompression ("CLADE") solution does not require look back in order to achieve useful compression results.

In a frequent pattern compression ("FPC") approach, if a cache-line word pattern is repeated in the stream, it may be plugged into a dictionary so that the stream may be compressed by replacing all instances of the word pattern with an index pointing to the dictionary. FPC approaches tend to build one dictionary and do not progressively construct dictionaries to further improve the compression ratio of a data stream. An FPC methodolgy, for example, may sort all the words in a data stream based on their frequency in the data stream and then build a single dictionary out of the top 1000 words or so.

A CLADE solution may include a multi-pass code compression algorithm that runs in an iterative fashion in an effort to enhance its results over time. CLADE embodiments rely on gradually eliminating the least useful bit in words of a cache line for the construction of the dictionary to provide for building better dictionaries with more highly used entries. Generally, CLADE removes some bits from each word in a cache line and builds a dictionary. Then, it may remove other bits and builds a next dictionary, and so on. Advantageously, the compression of a data image by a CLADE embodiment may occur off-line while the decompression happens on-line and with low-latency delivery of the decompressed image. In some CLADE embodiments, it is envisioned that three dictionaries may be produce optimal compression results. Even so, a CLADE solution is not limited to including three dictionaries and may include more or less than three. A more detailed explanation of exemplary CLADE embodiments will be described below with reference to the figures.

Figure 1B:
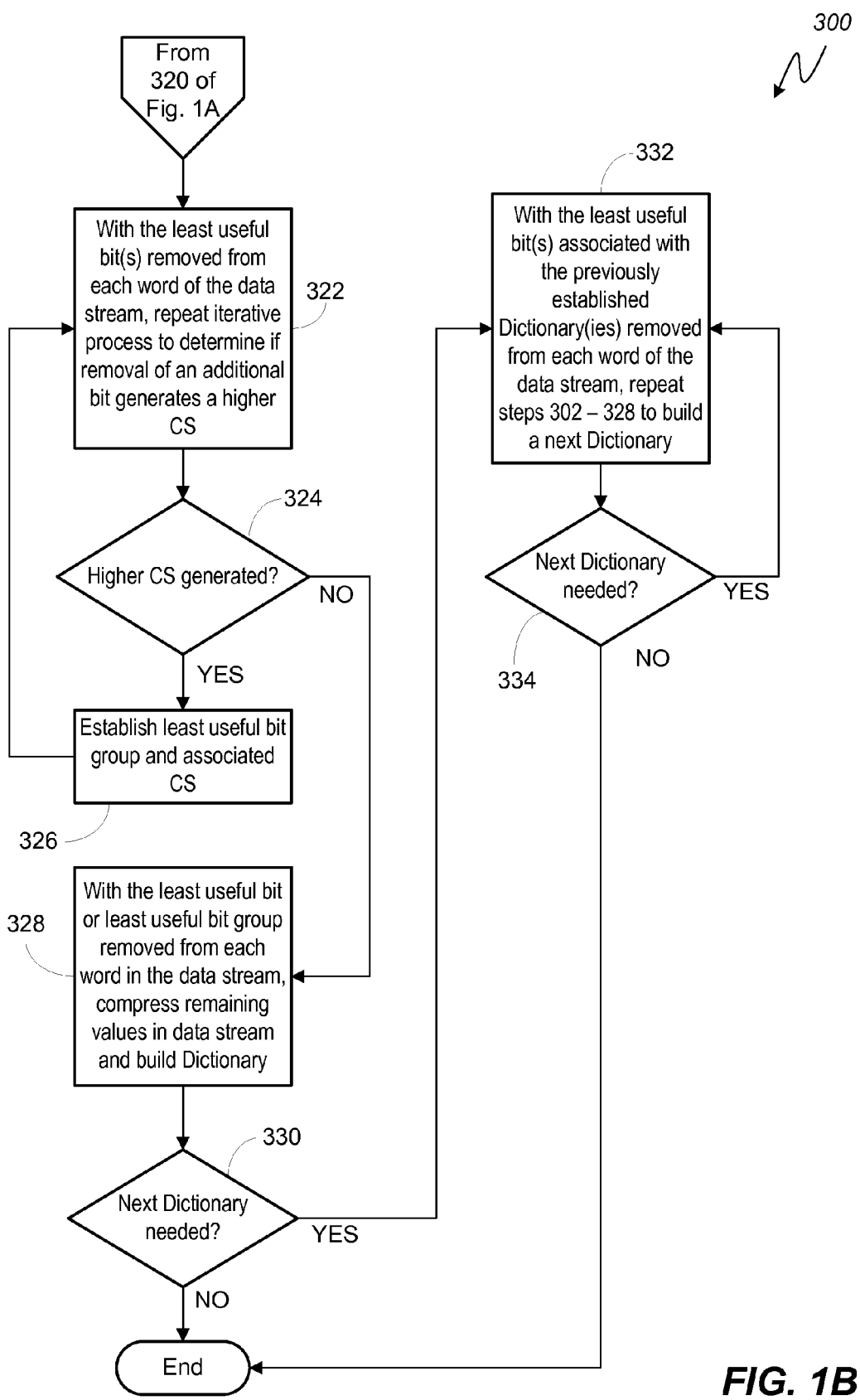

FIGS. 1A-1B are a logical flowchart illustrating a method 300 for data stream compression according to a cache-line level compression and decompression ("CLADE") embodiment. Beginning at block 302, a single bit associated with a certain position may be removed from each word, for example each 32-bit word, in an uncompressed data stream. Notably, for the purposes of this description, each word in a cache line may be 32-bits in size although it is envisioned that CLADE embodiments may be applicable for the compression and decompression of data streams composed of words of smaller or larger sizes, such as 16-bit or 64-bit sizes for example.

After removal of the bit from each word, at block 304 a frequent pattern compression ("FPC") methodology, or other compression methodology, may be applied to the data stream in an effort to identify bit patterns in the remaining 31-bit partial word values. Notably, it is envisioned that after removal of the particular bit, some word values may include recognizable bit patterns while others do not. Next, at block 306, a compression score may be generated for the resulting compressed image. The compression score may be the output of an objective function that produces a weighted sum of factors indicative of the "success" of the compression step at block 304. Generally speaking, the more bit patterns that are recognized across the remaining word values, the better the compression. Even so, factors considered by an objective function may be any combination of the following factors including, but not limited to, compression ratio, average length of dictionary entries, number of dictionaries previously instantiated, etc. It is envisioned that particular factors considered by an objective function may be weighted such that one contributes to an output compression score more than another. For example, it is envisioned that an objective function may quadratically weight a compression ratio factor while other considered factors are weighted sublinearly.

Returning to the method 300, after the compression score is established at block 306 it is associated with the bit location of the bit removed at block 302 and the bit is established as the least useful bit. The method moves to decision block 308. At decision block 308, the CLADE method determines if a next bit position is available. If a next bit position is available, the "yes" branch is followed to block 310. At block 310, a bit in a next bit position is removed from each word of the data stream and, subsequently, at block 312 the data stream is compressed in an effort to identify bit patterns in the remaining 31-bit partial word values. At block 314 a new compression score is generated to evaluate the relative success of the compression when the bit from block 310 is removed from the data stream. The method 300 continues to decision block 316.

At decision block 316, if the newly generated compression score is higher than the previous compression score, i.e. the compression of the data stream was more successful than the previous compression effort, then the "yes" branch is followed to block 318 and the least useful bit designation is updated to the last bit removed. The method returns then to decision block 308 and the loop of blocks 310 through 318 continues until a single bit of the 32-bits in the words is identified as the least useful bit. Notably, the least useful bit will be the bit that, when removed, conditions the cache line data stream for the most successful compression.

Once all the bit locations have been tested for the least useful bit status, the "no" branch is followed from decision block 308 and the last bit to be designated the least useful (the bit whose removal from the data stream produced the highest compression score) is established as the least useful single bit at block 320. The method 300 continues to block 322 of FIG. 1B.

At block 322, with the least useful single bit removed from each word in the data stream, a second bit is removed from each word and, with the pair of bits removed, the data stream is compressed and a compression score established as described above. In this manner, each remaining bit location may be tested as a second bit for removal. At decision block 324, if any pair of bits being removed from the data stream results in a higher compression score for the data stream, then the a least useful bit group is established at block 326. Notably, the loop of blocks 322 through 326 may continue by testing the removal of 3 bits, 4 bits, 5 bits, etc. until the method 300 determines the particular combination of bits for removal that results in the highest compression score for the data stream.

Once no higher compression score can be established, the last group of bits designated as the least useful are removed at block 328 and the data stream is compressed to build a dictionary from the remaining values. The method 300 continues to decision block 330 and if an additional dictionary is required, the method 300 moves forward to make an additional compression pass at block 332. At block 332, steps 302 through 328 may be repeated to determined a second least useful bit group from the remaining words in the data stream still uncompressed after the first dictionary was built. A second dictionary may then be built with the second least useful bit group removed. The method 300 continues to decision block 334 and, if another dictionary is required, the "yes" branch is followed back to block 332 and the iterative process of determining the least useful bit or bit group is conducted on all words in the data stream not compressed after the previous rounds. If no additional dictionary is needed, the "no" branch is followed from decision block 334 and the method 300 ends. Once concluded, the method 300 may have produced a compressed data stream per a CLADE methodology. Notably, even after conclusion of a CLADE technique, particular words in a data stream may remain uncompressed.

Notably, it is envisioned that the objective function to produce a compression score may vary from round to round with the last round to build the last dictionary using an objective function comprised solely of a compression ratio value.

Figure 2:
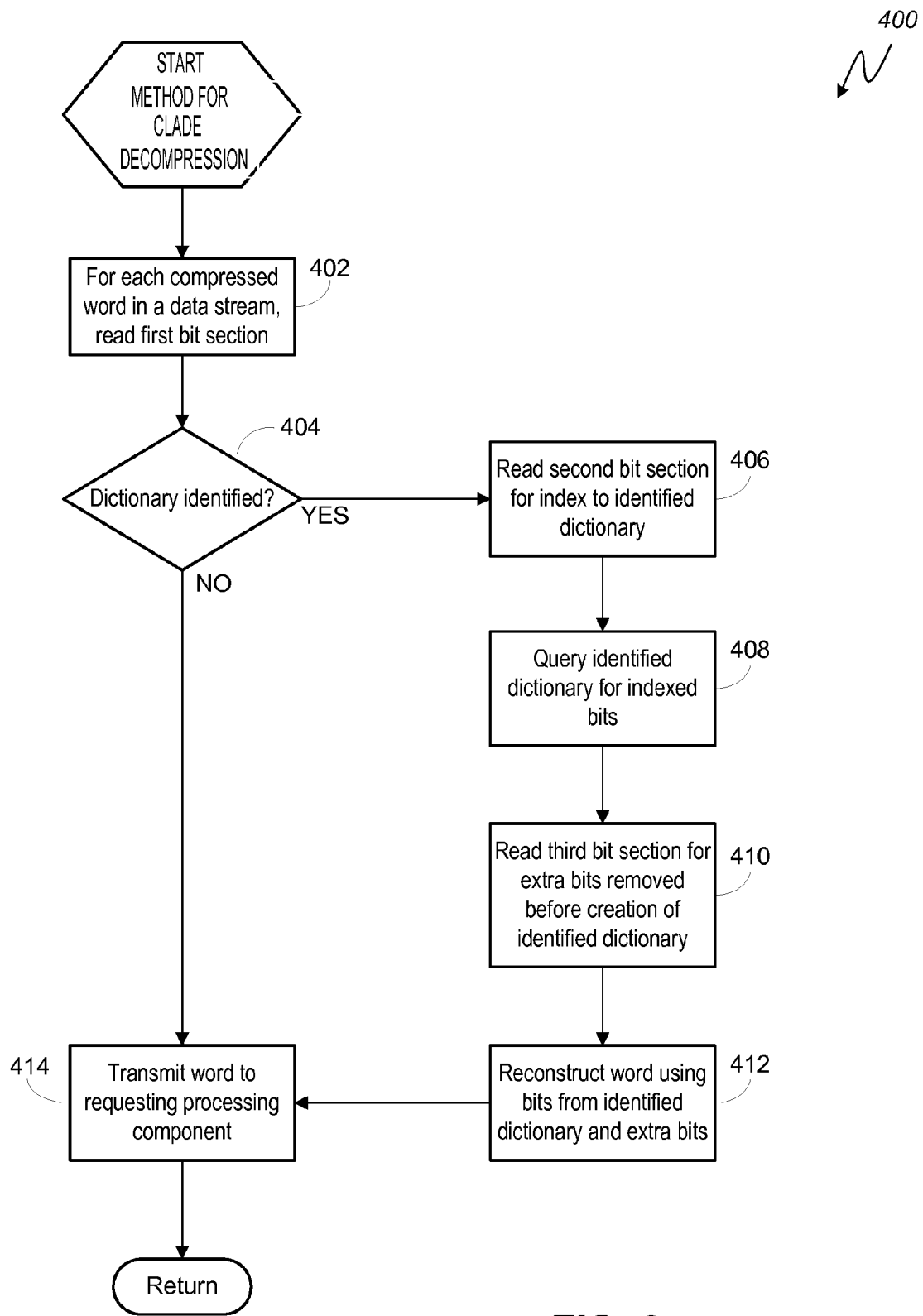
FIG. 2 is a logical flowchart illustrating a method data stream decompression according to a cache-line level compression and decompression ("CLADE") embodiment.

FIG. 2 is a logical flowchart illustrating a method 400 for data stream decompression according to a cache-line level compression and decompression ("CLADE") embodiment. The method 400 may be used to decompress a data stream previously compressed according to a CLADE technique, such as the exemplary method 300. More detail regarding the decompression (and, by extension, the compression) of a data image compressed according to a CLADE methodology will be discussed relative to FIG. 3.

Beginning with block 402, a first bit section of each word in a compressed data stream may be read. In certain embodiments, the first bit section may comprise two bits. The two bits may represent 00, 01, 10 or 11, as would be understood by one of ordinary skill in the art. The first two bits may be used by a CLADE decompression technique to identify the word as either uncompressed or compressed and associated with one of three dictionaries that resulted from the original compression. At decision block 404, if a dictionary is not identified, then the word was not compressed and the "no" branch is followed to block 414. At block 414, the word is transmitted to a requesting processing component.

Returning to decision block 404, if the first bit section indicates a dictionary, then the "yes" branch is followed to block 406 and a second bit section is read to determine an index to the identified dictionary. At block 408, based on the index the dictionary is queried for the indexed bits that will be required in order to rebuild, i.e. decompress, the word. At block 410, a third bit section is read to determine the least useful bits that were removed prior to compression of the word and creation of the dictionary. Subsequently, at block 412, the final word is rebuilt using the indexed bits from the dictionary and the extra bits from the third bit section of the compressed word. The uncompressed word is then provided to a requesting processing component at block 414 and the method 400 moves on to decompress a next word in the cache line.

Figure 3:
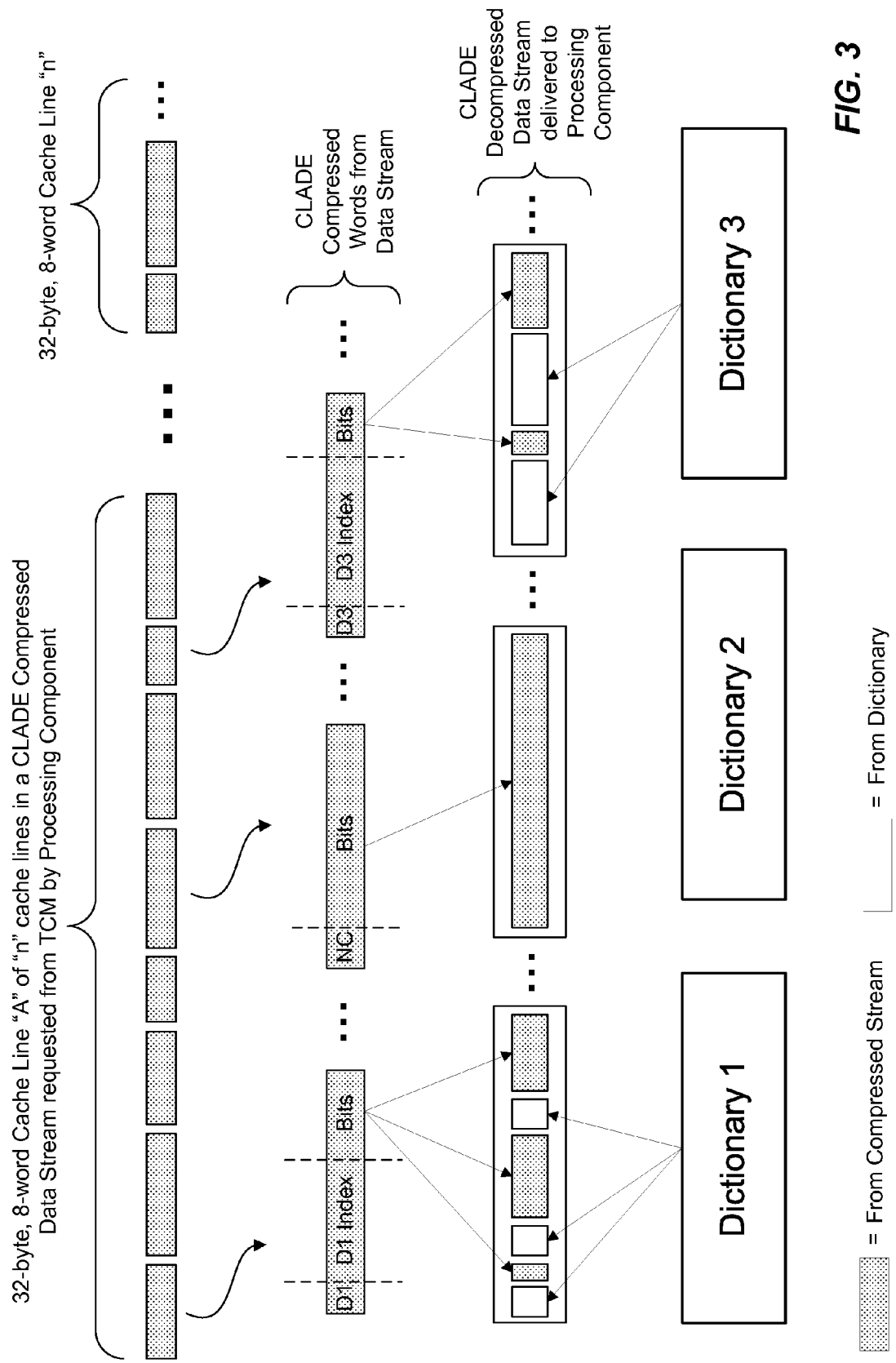
FIG. 3 illustrates the decompression of a data stream that was compressed using a cache-line level compression and decompression ("CLADE") embodiment.

FIG. 3 illustrates the decompression of an exemplary data stream comprised of 32-byte, 8-word cache lines that were compressed using a cache-line level compression and decompression ("CLADE") embodiment. As can be seen from the FIG. 3 illustration, each compressed word in the exemplary cache line "A" of the compressed data stream may comprise three bit sections. Further to that which was explained above, the first bit section may indicate the particular dictionary, Dictionary 1 ("D1"), Dictionary 2 ("D2") or Dictionary 3 ("D3") with which the compressed word is associated or indicate that the word is not compressed ("NC"). The second bit section may include an index to bits stored in the associated dictionary and needed for decompression of the word. And, the third bit section may include the extra bits needed in combination with the indexed bits in order to reconstruct the final word.

Notably, as illustrated by FIG. 3, the particular dictionary with which a word is associated will determine the order of interleaving the indexed bits with the extra bits from the third bit section.

Figure 4:
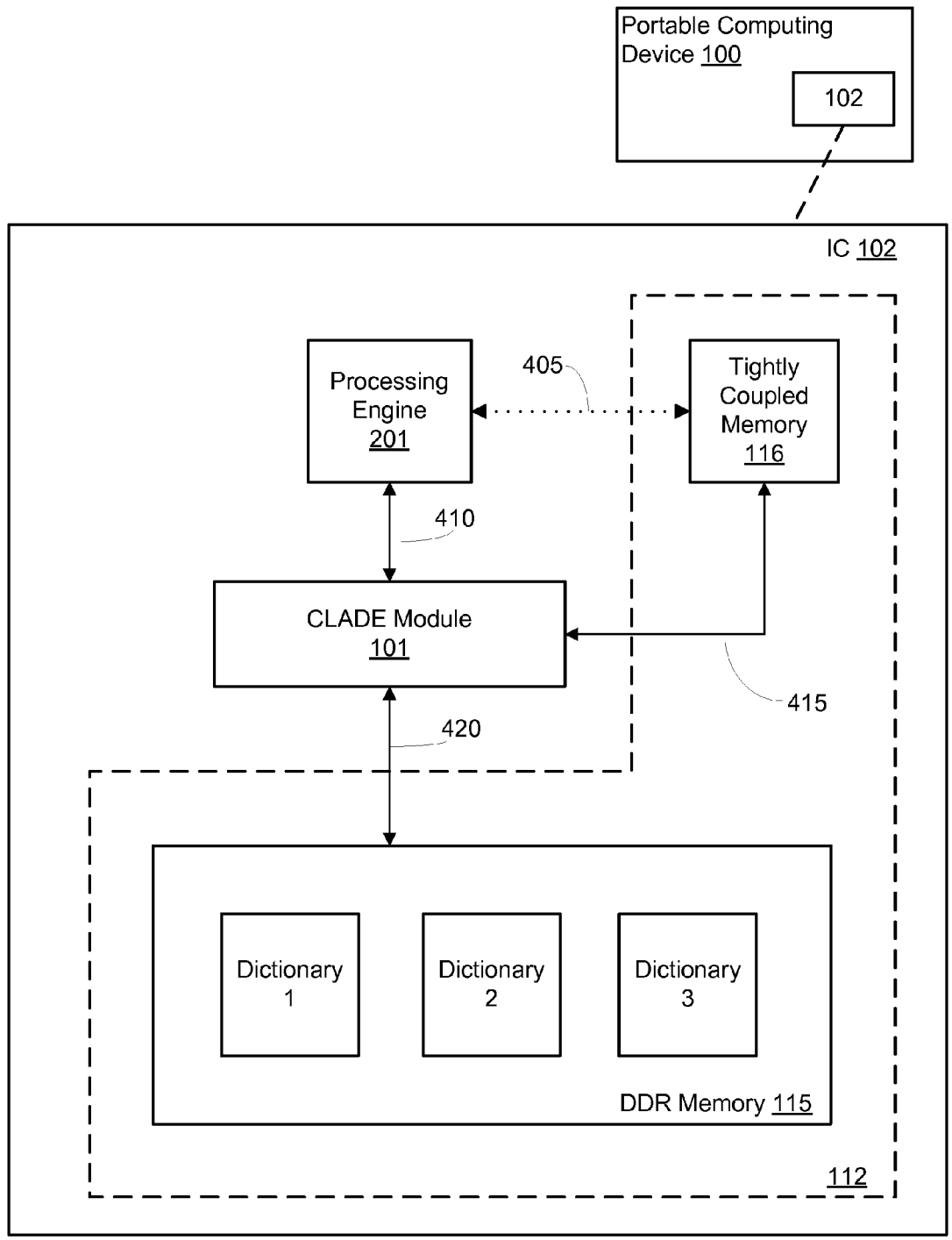
FIG. 4 is a functional block diagram illustrating an embodiment of an on-chip system for compressing and decompressing a data stream according to a cache-line level compression and decompression ("CLADE") technique.

FIG. 4 is a functional block diagram illustrating an embodiment of an on-chip system for compressing and decompressing a data stream according to a cache-line level compression and decompression ("CLADE") technique. As can be seen in the FIG. 4 illustration, a processing engine 210 may be associated with a TCM component 116 that stores compressed data needed by the processing engine 210. The processing engine 210 may request 405 the data from the TCM component 116, as is understood by one of ordinary skill in the art. Notably, because the data may have been stored in the TCM component 116 in a compressed form, such as may be the result of a CLADE technique, the CLADE module 101 may decompress 415 the data using a CLADE decompression methodology and provide 410 the decompressed data stream to the processing engine 210.

Because decompression using a CLADE technique requires access to indexed bits stored in one or more instantiated dictionaries, the CLADE module 101 may queries dictionaries, such as Dictionaries 1, 2 and 3 instantiated in exemplary double data rate ("DDR") memory 115. Notably, although the present functional block diagram illustrates the dictionaries as existing in a DDR memory, it is envisioned that any on-chip or off-chip memory types may be used to store dictionaries that are the result of a CLADE compression methodology such as, but not limited to, SRAM, ROM, EEPROM, DRAM, eDRAM, Flash, Phase-Change Memory, Memristor, and disk.

Figure 5:
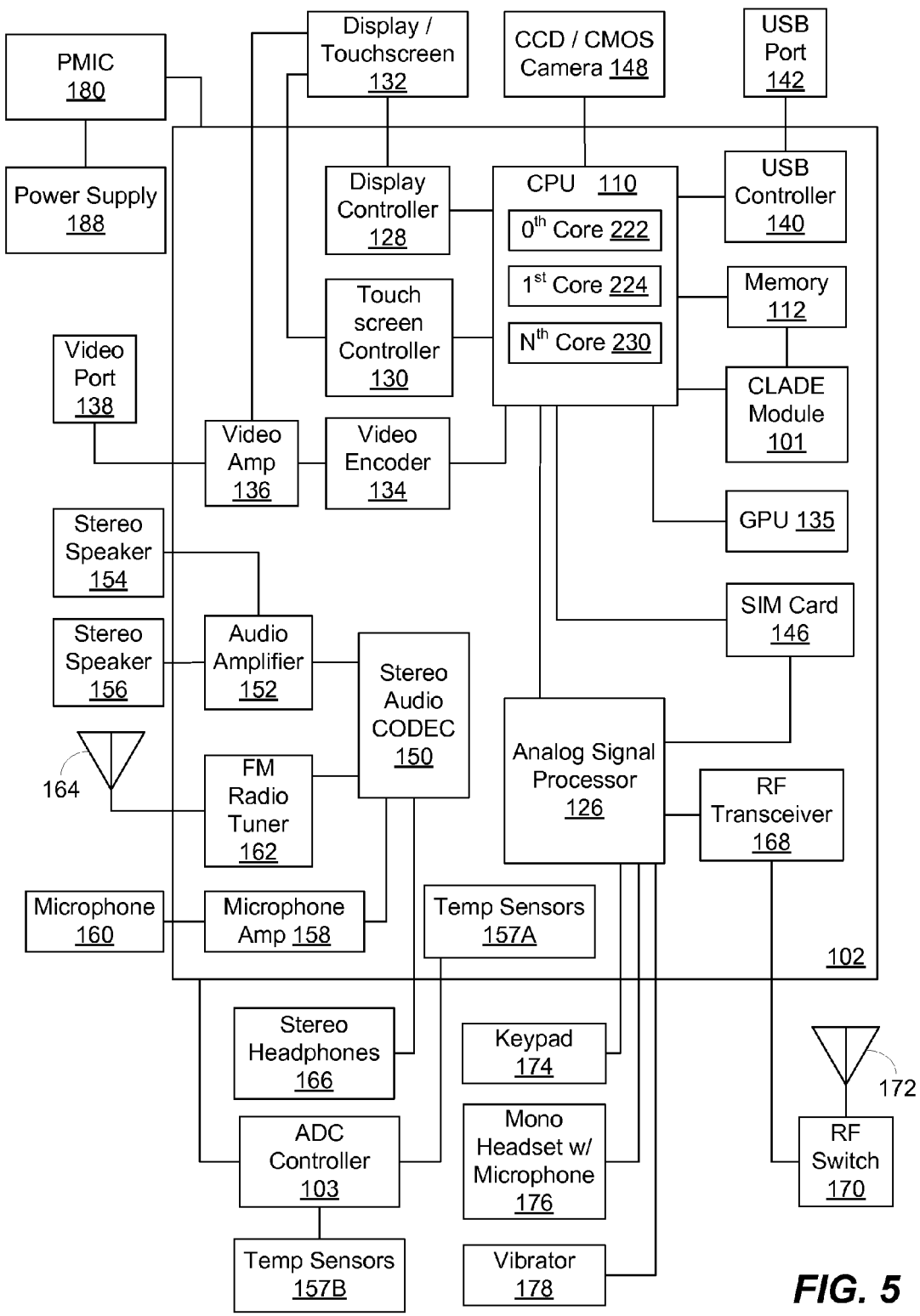
FIG. 5 is a functional block diagram illustrating an exemplary, non-limiting aspect of a portable computing device ("PCD") in the form of a wireless telephone for implementing cache-line level compression and decompression ("CLADE") techniques.

FIG. 5 is a functional block diagram illustrating an exemplary, non-limiting aspect of a portable computing device ("PCD") 100 in the form of a wireless telephone for implementing cache-line level compression and decompression ("CLADE") techniques. As shown, the PCD 100 includes an on-chip system 102 that includes a multi-core central processing unit ("CPU") 110 and an analog signal processor 126 that are coupled together. The CPU 110 may comprise a zeroth core 222, a first core 224, and an Nth core 230 as understood by one of ordinary skill in the art. Further, instead of a CPU 110, a digital signal processor ("DSP") may also be employed as understood by one of ordinary skill in the art.

In general, CLADE module 101 may be formed from hardware and/or firmware and may be responsible for compressing data streams and/or decompressing data streams according to various CLADE techniques. As illustrated in FIG. 5, a display controller 128 and a touch screen controller 130 are coupled to the digital signal processor 110. A touch screen display 132 external to the on-chip system 102 is coupled to the display controller 128 and the touch screen controller 130. PCD 100 may further include a video encoder 134, e.g., a phase-alternating line ("PAL") encoder, a sequential couleur avec memoire ("SECAM") encoder, a national television system(s) committee ("NTSC") encoder or any other type of video encoder 134. The video encoder 134 is coupled to the multi-core CPU 110. A video amplifier 136 is coupled to the video encoder 134 and the touch screen display 132. A video port 138 is coupled to the video amplifier 136. As depicted in FIG. 5, a universal serial bus ("USB") controller 140 is coupled to the CPU 110. Also, a USB port 142 is coupled to the USB controller 140. A memory 112, which may include a PoP memory, a cache or tightly coupled memory 116, a mask ROM/Boot ROM, a boot OTP memory, a DDR memory 115 may also be coupled to the CPU 110. A subscriber identity module ("SIM") card 146 may also be coupled to the CPU 110. Further, as shown in FIG. 5, a digital camera 148 may be coupled to the CPU 110. In an exemplary aspect, the digital camera 148 is a charge-coupled device ("CCD") camera or a complementary metal-oxide semiconductor ("CMOS") camera.

As further illustrated in FIG. 5, a stereo audio CODEC 150 may be coupled to the analog signal processor 126. Moreover, an audio amplifier 152 may be coupled to the stereo audio CODEC 150. In an exemplary aspect, a first stereo speaker 154 and a second stereo speaker 156 are coupled to the audio amplifier 152. FIG. 5 shows that a microphone amplifier 158 may be also coupled to the stereo audio CODEC 150. Additionally, a microphone 160 may be coupled to the microphone amplifier 158. In a particular aspect, a frequency modulation ("FM") radio tuner 162 may be coupled to the stereo audio CODEC 150. Also, an FM antenna 164 is coupled to the FM radio tuner 162. Further, stereo headphones 166 may be coupled to the stereo audio CODEC 150.

FIG. 5 further indicates that a radio frequency ("RF") transceiver 168 may be coupled to the analog signal processor 126. An RF switch 170 may be coupled to the RF transceiver 168 and an RF antenna 172. As shown in FIG. 5, a keypad 174 may be coupled to the analog signal processor 126. Also, a mono headset with a microphone 176 may be coupled to the analog signal processor 126. Further, a vibrator device 178 may be coupled to the analog signal processor 126. FIG. 5 also shows that a power supply 188, for example a battery, is coupled to the on-chip system 102 through a power management integrated circuit ("PMIC") 180. In a particular aspect, the power supply 188 includes a rechargeable DC battery or a DC power supply that is derived from an alternating current ("AC") to DC transformer that is connected to an AC power source.

The CPU 110 may also be coupled to one or more internal, on-chip thermal sensors 157A as well as one or more external, off-chip thermal sensors 157B. The on-chip thermal sensors 157A may comprise one or more proportional to absolute temperature ("PTAT") temperature sensors that are based on vertical PNP structure and are usually dedicated to complementary metal oxide semiconductor ("CMOS") very large-scale integration ("VLSI") circuits. The off-chip thermal sensors 157B may comprise one or more thermistors. The thermal sensors 157 may produce a voltage drop that is converted to digital signals with an analog-to-digital converter ("ADC") controller (not shown). However, other types of thermal sensors 157 may be employed.

The touch screen display 132, the video port 138, the USB port 142, the camera 148, the first stereo speaker 154, the second stereo speaker 156, the microphone 160, the FM antenna 164, the stereo headphones 166, the RF switch 170, the RF antenna 172, the keypad 174, the mono headset 176, the vibrator 178, thermal sensors 157B, the PMIC 180 and the power supply 188 are external to the on-chip system 102. It will be understood, however, that one or more of these devices depicted as external to the on-chip system 102 in the exemplary embodiment of a PCD 100 in FIG. 5 may reside on chip 102 in other exemplary embodiments.

In a particular aspect, one or more of the method steps described herein may be implemented by executable instructions and parameters stored in the memory 112 or as form the BWC manager 101. Further, the BWC manager 101, the memory 112, the instructions stored therein, or a combination thereof may serve as a means for performing one or more of the method steps described herein.

Figure 6:
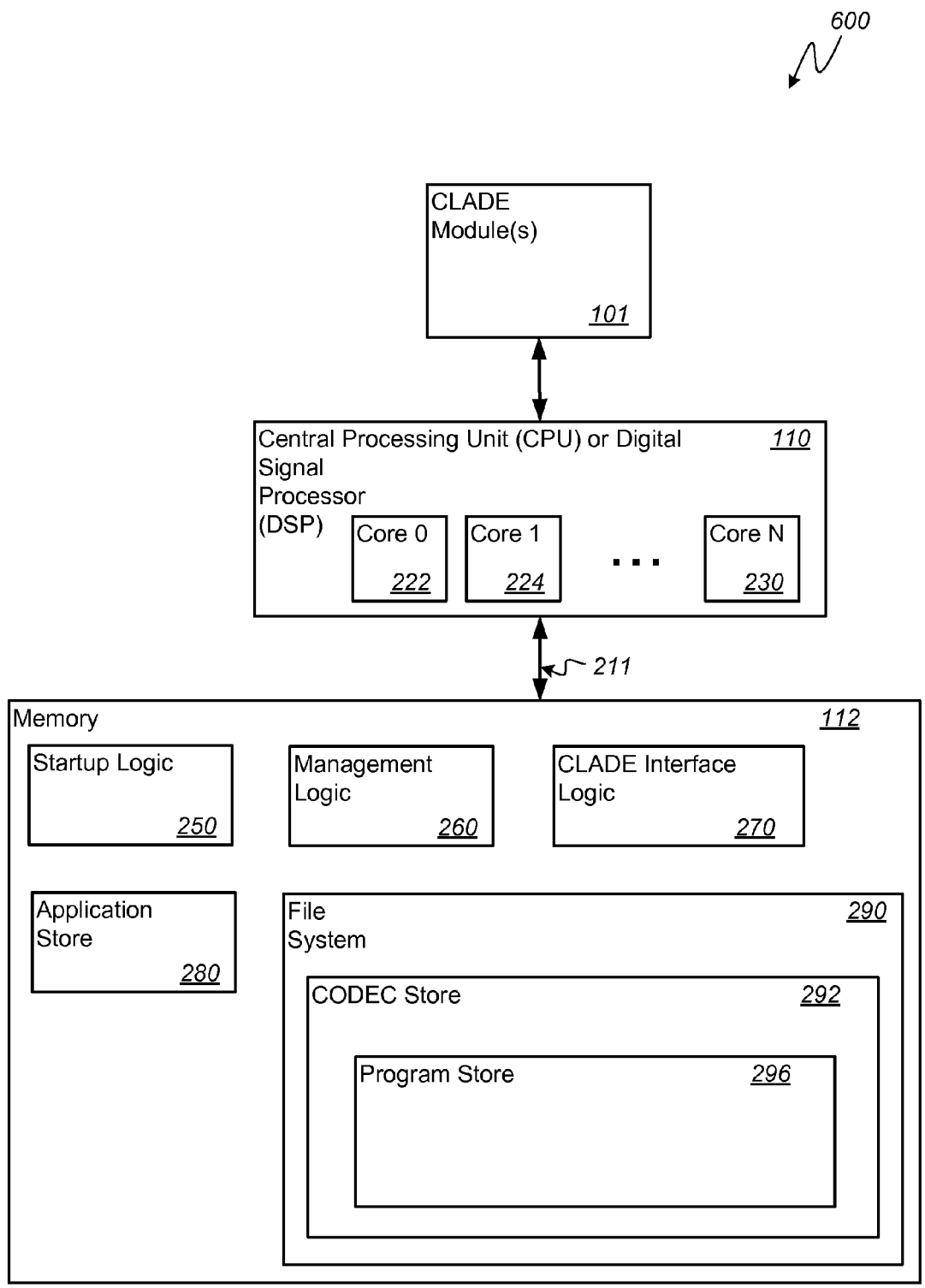
FIG. 6 is a schematic diagram illustrating an exemplary software architecture of the PCD of FIG. 5 for implementing cache-line level compression and decompression ("CLADE") solutions.

FIG. 6 is a schematic diagram 600 illustrating an exemplary software architecture of the PCD of FIG. 5 for implementing cache-line level compression and decompression ("CLADE") solutions. As illustrated in FIG. 6, the CPU or digital signal processor 110 is coupled to the memory 112 via main bus 211. The CPU 110, as noted above, is a multiple-core processor having N core processors. That is, the CPU 110 includes a first core 222, a second core 224, and an $N^{th}$ core 230. As is known to one of ordinary skill in the art, each of the first core 222, the second core 224 and the $N^{th}$ core 230 are available for supporting a dedicated application or program. Alternatively, one or more applications or programs may be distributed for processing across two or more of the available cores.

The CPU 110 may receive commands from the CLADE module(s) 101 that may comprise software and/or hardware. If embodied as software, the module(s) 101 comprise instructions that are executed by the CPU 110 that issues commands to other application programs being executed by the CPU 110 and other processors.

The first core 222, the second core 224 through to the Nth core 230 of the CPU 110 may be integrated on a single integrated circuit die, or they may be integrated or coupled on separate dies in a multiple-circuit package. Designers may couple the first core 222, the second core 224 through to the $N^{th}$ core 230 via one or more shared caches and they may implement message or instruction passing via network topologies such as bus, ring, mesh and crossbar topologies.

Bus 211 may include multiple communication paths via one or more wired or wireless connections, as is known in the art and described above in the definitions. The bus 211 may have additional elements, which are omitted for simplicity, such as controllers, buffers (caches), drivers, repeaters, and receivers, to enable communications. Further, the bus 211 may include address, control, and/or data connections to enable appropriate communications among the aforementioned components.

When the logic used by the PCD 100 is implemented in software, as is shown in FIG. 6, it should be noted that one or more of startup logic 250, management logic 260, CLADE interface logic 270, applications in application store 280 and portions of the file system 290 may be stored on any computer-readable medium for use by, or in connection with, any computer-related system or method. In the context of this document, a computer-readable medium is an electronic, magnetic, optical, or other physical device or means that can contain or store a computer program and data for use by or in connection with a computer-related system or method. The various logic elements and data stores may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random-access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, for instance via optical scanning of the paper or other medium, then compiled, interpreted or otherwise processed in a suitable manner if necessary, and then stored in a computer memory.

In an alternative embodiment, where one or more of the startup logic 250, management logic 260 and perhaps the CLADE interface logic 270 are implemented in hardware, the various logic may be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The memory 112 is a non-volatile data storage device such as a flash memory or a solid-state memory device. Although depicted as a single device, the memory 112 may be a distributed memory device with separate data stores coupled to the digital signal processor 110 (or additional processor cores).

The startup logic 250 includes one or more executable instructions for selectively identifying, loading, and executing a select program for compressing data streams and/or decompressing data streams according to CLADE techniques. The startup logic 250 may identify, load and execute a select CLADE program. An exemplary select program may be found in the program store 296 of the embedded file system 290. The exemplary select program, when executed by one or more of the core processors in the CPU 110 may operate in accordance with one or more signals provided by the CLADE module 101 to compress and/or decompress a data stream.

The management logic 260 includes one or more executable instructions for terminating a CLADE program on one or more of the respective processor cores, as well as selectively identifying, loading, and executing a more suitable replacement program. The management logic 260 is arranged to perform these functions at run time or while the PCD 100 is powered and in use by an operator of the device. A replacement program may be found in the program store 296 of the embedded file system 290.

The interface logic 270 includes one or more executable instructions for presenting, managing and interacting with external inputs to observe, configure, or otherwise update information stored in the embedded file system 290. In one embodiment, the interface logic 270 may operate in conjunction with manufacturer inputs received via the USB port 142. These inputs may include one or more programs to be deleted from or added to the program store 296. Alternatively, the inputs may include edits or changes to one or more of the programs in the program store 296. Moreover, the inputs may identify one or more changes to, or entire replacements of one or both of the startup logic 250 and the management logic 260. By way of example, the inputs may include a change to the objective function(s) used to evaluate the compression results after removal of the least useful bit(s).

The interface logic 270 enables a manufacturer to controllably configure and adjust an end user's experience under defined operating conditions on the PCD 100. When the memory 112 is a flash memory, one or more of the startup logic 250, the management logic 260, the interface logic 270, the application programs in the application store 280 or information in the embedded file system 290 may be edited, replaced, or otherwise modified. In some embodiments, the interface logic 270 may permit an end user or operator of the PCD 100 to search, locate, modify or replace the startup logic 250, the management logic 260, applications in the application store 280 and information in the embedded file system 290. The operator may use the resulting interface to make changes that will be implemented upon the next startup of the PCD 100. Alternatively, the operator may use the resulting interface to make changes that are implemented during run time.

The embedded file system 290 includes a hierarchically arranged CODEC store 292 that may include any number of CLADE solutions. In this regard, the file system 290 may include a reserved section of its total file system capacity for the storage of information for the configuration and management of the various CLADE algorithms used by the PCD 100.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example. Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the drawings, which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Therefore, although selected aspects have been illustrated and described in detail, it will be understood that various substitutions and alterations may be made therein without departing from the spirit and scope of the present invention, as defined by the following claims.

What is claimed is:

1. A method for cache-line level compression and decompression ("CLADE") of a data stream in a system on a chip ("SoC") in a portable computing device ("PCD"), the method comprising:
   iteratively removing combinations of bits from locations in each word of a cache line of an uncompressed data stream;
   for each combination of removed bits, analyzing remaining bits in the word values of the cache line using an objective function, wherein the objective function generates a compression score that quantifies the value of a dictionary built from the remaining bits in the word values of the cache line; and
   based on a highest compression score, generating a first dictionary from the remaining bits in the word values after removal of the combination of bits associated with the highest compression score.

2. The method of claim 1, further comprising:
compressing the cache line on a first round such that one or more of the words remains uncompressed after the first round compression and one or more of the words is compressed after the first round compression to include three bit sections, the first bit section indicating the first dictionary, the second bit section comprising an index to bits stored in the first dictionary, and the third bit section containing the removed combination of bits.

3. The method of claim 2, further comprising:
iteratively removing combinations of bits from locations in each word of the cache line uncompressed after the first round;
for each combination of removed bits from locations in each word of the cache line uncompressed after the first round, analyzing remaining bits in the word values using an objective function, wherein the objective function generates a compression score that quantifies the value of a dictionary built from the remaining bits in the word values; and
based on a highest compression score, generating a second dictionary from the remaining bits in the word values after removal of the combination of bits from locations in each word of the cache line uncompressed after the first round that is associated with the highest compression score.

4. The method of claim 3, further comprising:
compressing the cache line on a second round such that one or more of the words remains uncompressed after the second round compression and one or more of the words uncompressed after the first round is compressed after the second round compression to include three bit sections, the first bit section indicating the second dictionary, the second bit section comprising an index to bits stored in the second dictionary, and the third bit section containing the removed combination of bits.

5. The method of claim 4, further comprising:
iteratively removing combinations of bits from locations in each word of the cache line uncompressed after the first and second rounds;
for each combination of removed bits from locations in each word of the cache line uncompressed after the first and second rounds, analyzing remaining bits in the word values using an objective function, wherein the objective function generates a compression score that quantifies the value of a dictionary built from the remaining bits in the word values; and
based on a highest compression score, generating a third dictionary from the remaining bits in the word values after removal of the combination of bits from locations in each word of the cache line uncompressed after the first and second rounds that is associated with the highest compression score.

6. The method of claim 5, further comprising:
compressing the cache line on a third round such that one or more of the words uncompressed after the first and second rounds is compressed after the third round compression to include three bit sections, the first bit section indicating the third dictionary, the second bit section comprising an index to bits stored in the third dictionary, and the third bit section containing the removed combination of bits.

7. The method of claim 6, wherein the cache line is saved to a tightly coupled memory device after the third round of compression.

8. The method of claim 7, further comprising:
recognizing a request from a processing component to the tightly coupled memory device for the cache line;
decompressing each word in the cache line by:
identifying a dictionary from the first bit section of the word;
querying the identified dictionary for bits indexed in the second bit section of the word; and
reconstructing the word by interleaving the queried bits with the removed combination of bits from the third bit section of the word; and
transmitting the decompressed word to the processing component.

9. The method of claim 1, wherein the objective function comprises a quadratically weighted compression ratio value.

10. The method of claim 1, wherein the PCD is in the form of a wireless telephone.

11. A system for cache-line level compression and decompression ("CLADE") of a data stream in a system on a chip ("SoC") in a portable computing device ("PCD"), the system comprising:
a CLADE module operable for:
iteratively removing combinations of bits from locations in each word of a cache line of an uncompressed data stream;
for each combination of removed bits, analyzing remaining bits in the word values of the cache line using an objective function, wherein the objective function generates a compression score that quantifies the value of a dictionary built from the remaining bits in the word values of the cache line; and
based on a highest compression score, generating a first dictionary from the remaining bits in the word values after removal of the combination of bits associated with the highest compression score.

12. The system of claim 11, wherein the CLADE module is further operable for compressing the cache line on a first round such that one or more of the words remains uncompressed after the first round compression and one or more of the words is compressed after the first round compression to include three bit sections, the first bit section indicating the first dictionary, the second bit section comprising an index to bits stored in the first dictionary, and the third bit section containing the removed combination of bits.

13. The system of claim 12, wherein the CLADE module is further operable for:
iteratively removing combinations of bits from locations in each word of the cache line uncompressed after the first round;
for each combination of removed bits from locations in each word of the cache line uncompressed after the first round, analyzing remaining bits in the word values using an objective function, wherein the objective function generates a compression score that quantifies the value of a dictionary built from the remaining bits in the word values; and
based on a highest compression score, generating a second dictionary from the remaining bits in the word values after removal of the combination of bits from locations in each word of the cache line uncompressed after the first round that is associated with the highest compression score.

14. The system of claim 13, wherein the CLADE module is further operable for:
compressing the cache line on a second round such that one or more of the words remains uncompressed after the second round compression and one or more of the words uncompressed after the first round is compressed after the second round compression to include three bit sections, the first bit section indicating the second dictionary, the second bit section comprising an index to bits stored in the second dictionary, and the third bit section containing the removed combination of bits.

15. The system of claim 14, wherein the CLADE module is further operable for:
iteratively removing combinations of bits from locations in each word of the cache line uncompressed after the first and second rounds;
for each combination of removed bits from locations in each word of the cache line uncompressed after the first and second rounds, analyzing remaining bits in the word values using an objective function, wherein the objective function generates a compression score that quantifies the value of a dictionary built from the remaining bits in the word values; and
based on a highest compression score, generating a third dictionary from the remaining bits in the word values after removal of the combination of bits from locations in each word of the cache line uncompressed after the first and second rounds that is associated with the highest compression score.

16. The system of claim 15, wherein the CLADE module is further operable for:
compressing the cache line on a third round such that one or more of the words uncompressed after the first and second rounds is compressed after the third round compression to include three bit sections, the first bit section indicating the third dictionary, the second bit section comprising an index to bits stored in the third dictionary, and the third bit section containing the removed combination of bits.

17. The system of claim 16, wherein the cache line is saved to a tightly coupled memory device after the third round of compression.

18. The system of claim 17, wherein the CLADE module is further operable for:
recognizing a request from a processing component to the tightly coupled memory device for the cache line;
decompressing each word in the cache line by:
identifying a dictionary from the first bit section of the word;
querying the identified dictionary for bits indexed in the second bit section of the word; and
reconstructing the word by interleaving the queried bits with the removed combination of bits from the third bit section of the word; and
transmitting the decompressed word to the processing component.

19. The system of claim 11, wherein the objective function comprises a quadratically weighted compression ratio value.

20. The system of claim 11, wherein the PCD is in the form of a wireless telephone.

21. A computer program product comprising a computer usable medium having a computer readable program code embodied therein, said computer readable program code adapted to be executed to implement a method for cache-line level compression and decompression ("CLADE") of a data stream in a system on a chip ("SoC") in a portable computing device ("PCD"), said method comprising:
iteratively removing combinations of bits from locations in each word of a cache line of an uncompressed data stream;
for each combination of removed bits, analyzing remaining bits in the word values of the cache line using an objective function, wherein the objective function generates a compression score that quantifies the value of a dictionary built from the remaining bits in the word values of the cache line; and
based on a highest compression score, generating a first dictionary from the remaining bits in the word values after removal of the combination of bits associated with the highest compression score.

22. The computer program product of claim 21, said method further comprising:
compressing the cache line on a first round such that one or more of the words remains uncompressed after the first round compression and one or more of the words is compressed after the first round compression to include three bit sections, the first bit section indicating the first dictionary, the second bit section comprising an index to bits stored in the first dictionary, and the third bit section containing the removed combination of bits.

23. The computer program product of claim 22, said method further comprising:
iteratively removing combinations of bits from locations in each word of the cache line uncompressed after the first round;
for each combination of removed bits from locations in each word of the cache line uncompressed after the first round, analyzing remaining bits in the word values using an objective function, wherein the objective function generates a compression score that quantifies the value of a dictionary built from the remaining bits in the word values; and
based on a highest compression score, generating a second dictionary from the remaining bits in the word values after removal of the combination of bits from locations in each word of the cache line uncompressed after the first round that is associated with the highest compression score.

24. The computer program product of claim 23, said method further comprising:
compressing the cache line on a second round such that one or more of the words remains uncompressed after the second round compression and one or more of the words uncompressed after the first round is compressed after the second round compression to include three bit sections, the first bit section indicating the second dictionary, the second bit section comprising an index to bits stored in the second dictionary, and the third bit section containing the removed combination of bits.

25. The computer program product of claim 24, said method further comprising:
iteratively removing combinations of bits from locations in each word of the cache line uncompressed after the first and second rounds;
for each combination of removed bits from locations in each word of the cache line uncompressed after the first and second rounds, analyzing remaining bits in the word values using an objective function, wherein the objective function generates a compression score that quantifies the value of a dictionary built from the remaining bits in the word values; and
based on a highest compression score, generating a third dictionary from the remaining bits in the word values after removal of the combination of bits from locations in each word of the cache line uncompressed after the first and second rounds that is associated with the highest compression score.

26. The computer program product of claim 25, said method further comprising:

compressing the cache line on a third round such that one or more of the words uncompressed after the first and second rounds is compressed after the third round compression to include three bit sections, the first bit section indicating the third dictionary, the second bit section comprising an index to bits stored in the third dictionary, and the third bit section containing the removed combination of bits.

27. The computer program product of claim 26, wherein the cache line is saved to a tightly coupled memory device after the third round of compression.

28. The computer program product of claim 27, said method further comprising:
  recognizing a request from a processing component to the tightly coupled memory device for the cache line;
  decompressing each word in the cache line by:
    identifying a dictionary from the first bit section of the word;
    querying the identified dictionary for bits indexed in the second bit section of the word; and
    reconstructing the word by interleaving the queried bits with the removed combination of bits from the third bit section of the word; and
  transmitting the decompressed word to the processing component.

29. The computer program product of claim 21, wherein the objective function comprises a quadratically weighted compression ratio value.

30. The computer program product of claim 21, wherein the PCD is in the form of a wireless telephone.

* * * * *